US006485614B2

(12) United States Patent
Katoh et al.

(10) Patent No.: US 6,485,614 B2
(45) Date of Patent: Nov. 26, 2002

(54) METHOD TO STABILIZE A CARBON ALIGNMENT LAYER FOR LIQUID CRYSTAL DISPLAYS

(75) Inventors: Yoshimine Katoh, Sagamihara (JP); Yoshiki Nakagawa, Kyoto (JP); Shuhichi Odahara, Atsugi (JP); Mahesh Govind Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 09/727,572

(22) Filed: Nov. 30, 2000

(65) Prior Publication Data

US 2002/0063055 A1 May 30, 2002

(51) Int. Cl.[7] .......................... C07C 1/00; G02F 1/1337
(52) U.S. Cl. .................... 204/157.15; 349/124
(58) Field of Search ...................... 204/157.15; 349/124

(56) References Cited

U.S. PATENT DOCUMENTS

| 5,770,826 A | 6/1998 | Chaudhari et al. ...... 204/157.15 |
| 6,020,946 A | 2/2000 | Callegari et al. ........... 349/124 |
| 6,061,114 A | 5/2000 | Callegari et al. ........... 349/125 |

Primary Examiner—Edna Wong
(74) Attorney, Agent, or Firm—Thomas R. Berthold

(57) ABSTRACT

A method for improving the anchoring of liquid crystals on carbon alignment layers used in liquid crystal displays involves exposing the alignment layer to hydrogen atoms. The atomic hydrogen exposure passivates the surface of the carbon layer to stabilize the anchoring of the subsequently deposited liquid crystals. The substrate on which the carbon layer is supported is located beneath a stretched tungsten filament, and the substrate and filament are located in a vacuum chamber containing hydrogen gas. The heating of the tungsten filament by an appropriate power source dissociates the hydrogen gas into hydrogen atoms and the hydrogen atoms contact the surface of the carbon layer. The process is applicable to stabilize carbon alignment layers that have been formed by directional deposition of carbon, as well as carbon alignment layers where the alignment is caused by a separate ion irradiation step after the carbon layer is formed.

14 Claims, 2 Drawing Sheets

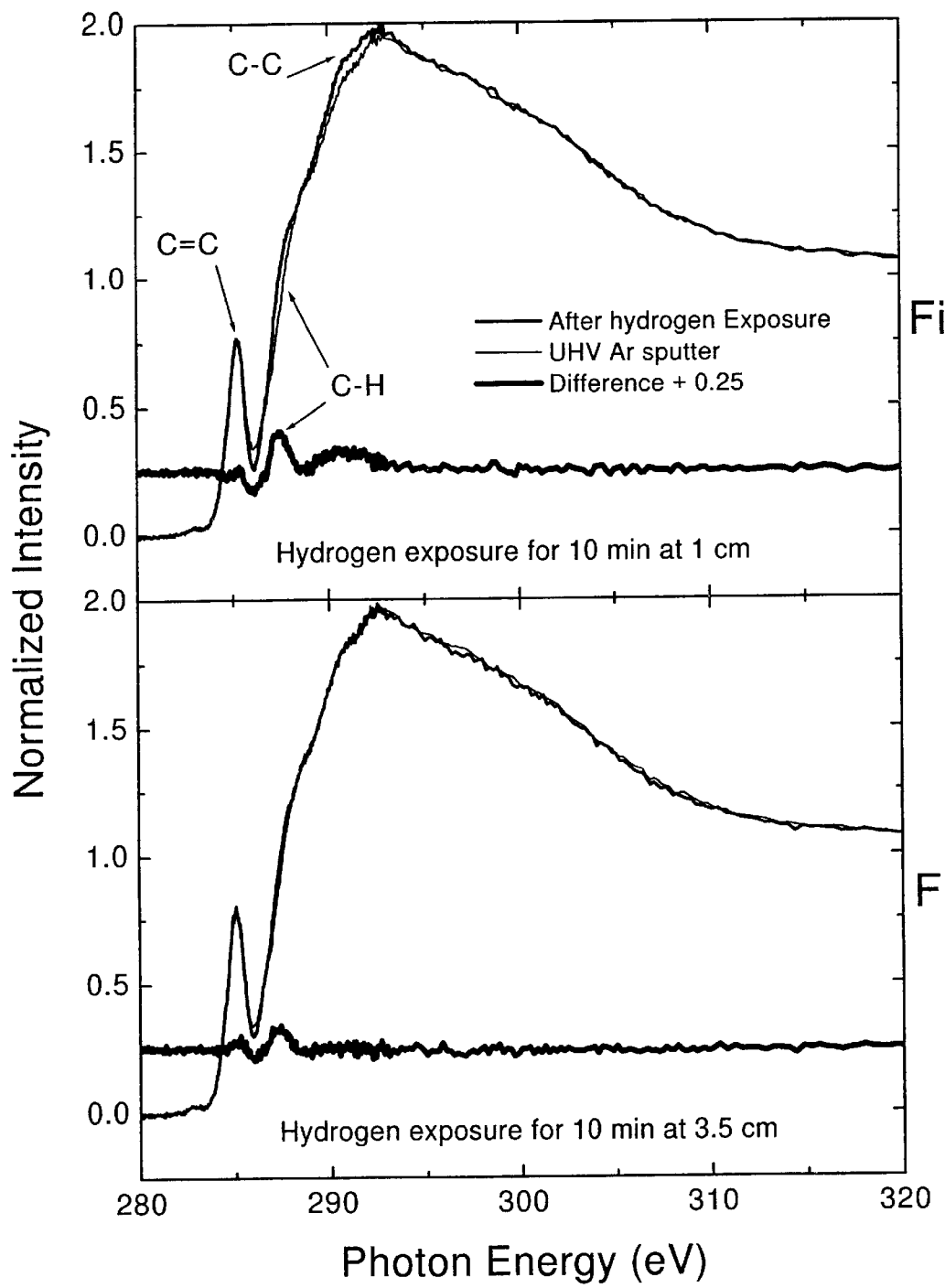

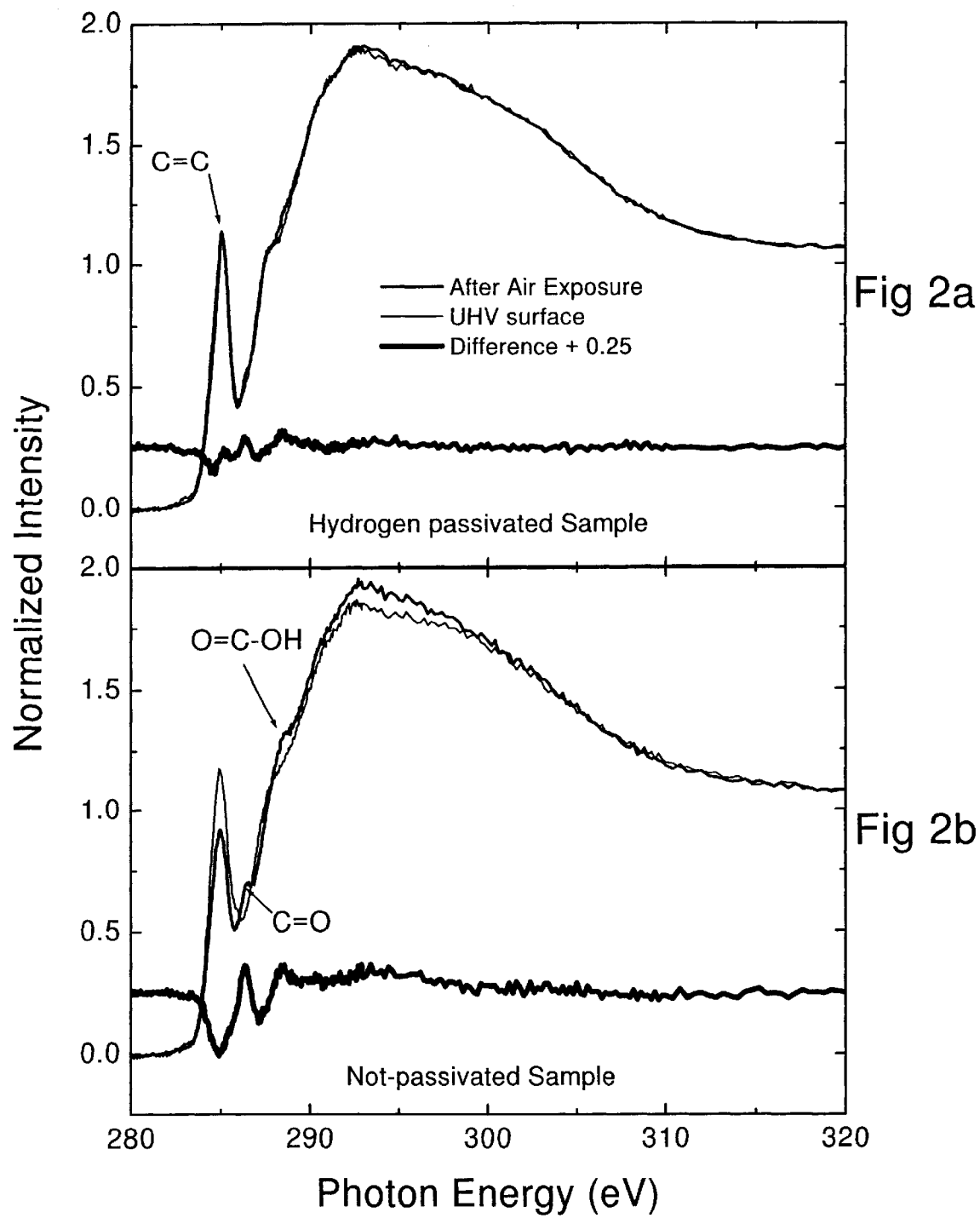

ND TO STABILIZE A CARBON
METHOD TO STABILIZE A CARBON ALIGNMENT LAYER FOR LIQUID CRYSTAL DISPLAYS

TECHNICAL FIELD

This invention relates to liquid crystal displays, and more particularly to a method to stabilize a carbon alignment layer for the liquid crystals.

BACKGROUND OF THE INVENTION

The alignment of liquid crystals (LC) in today's flat panel liquid crystal displays (LCD) is accomplished by placing a thin film of LCs on a mechanically rubbed polyimide film coated on a suitable substrate, such as an indium tin oxide (ITO) film formed on glass. Limitations imposed by the mechanical rubbing method (e.g., creating multiple domains for improving the viewing angle) in conjunction with the difficulty of optimizing polymer materials (e.g., polymers that avoid image sticking) make it highly desirable to use alternative materials and a non-contact LC alignment method. There are a number of different methods/materials which have been shown to create LC alignment besides rubbing, such as (i) stretching of a polymer, (ii) a Langmuir Blodgett film, (iii) a grating structure produced by microlithography, (iv) oblique angle deposition of SiOx, and (v) polarized UV irradiation of a polymer film.

More recently a viable non-contact method based on ion beam irradiation of a polyimide surface has been developed, as described in IBM's patent U.S. Pat. No. 5,770,826. The method involves placing the LCs on a polyimide surface which has been bombarded with low energy (about 100eV) Ar+ ions. This process has many characteristics which make it suitable for the manufacture of LC displays. This method has been extended to include alignment layers of "diamond-like" carbon (DLC), amorphous hydrogenated silicon, SiC, $SiO_2$, glass, $Si_3N_4$, $Al_2O_3$, $CeO_2$, $SnO_2$, and $ZnTiO_2$ films, as described in IBM's patent U.S. Pat. No. 6,020,946.

IBM's patent U.S. Pat. No. 6,061,114 describes a liquid crystal alignment layer made by directional deposition of a carbon film. In this case there is no need for a separate ion beam irradiation step.

One problem that has been discovered with respect to the ion beam irradiation method for LC alignment is that the anchoring energy of the LCs on ion beam treated DLC surfaces is not stable, but decreases substantially over a period of a few weeks.

What is needed is a method for LC alignment on DLC that allows the use of ion beam irradiation but results in a stable alignment layer so that the LCs retain their preferred alignment orientation.

SUMMARY OF THE INVENTION

The invention is a method for improving the anchoring of liquid crystals on a carbon alignment layer used in a liquid crystal display. The carbon alignment layer is a "diamond-like" carbon (DLC) film which is formed either by a conventional process or by exposing a polymer film, such as polyimide, to Ar ions. The carbon alignment layer is exposed to hydrogen atoms which passivate the surface of the carbon layer to stabilize the anchoring of the subsequently deposited liquid crystals. The substrate on which the carbon layer is supported is located beneath a stretched tungsten filament, and the substrate and filament are located in a vacuum chamber containing hydrogen gas. The heating of the tungsten filament by an appropriate power source dissociates the hydrogen gas into hydrogen atoms and the hydrogen atoms contact the surface of the carbon layer. The process is applicable to stabilize carbon alignment layers that have been formed by directional deposition of carbon, as well as carbon alignment layers where the alignment is caused by a separate ion irradiation step after the carbon layer is formed. As a result of the hydrogen passivation, the liquid crystals subsequently deposited on the passivated carbon alignment layer retain their alignment substantially longer than without the passivation treatment.

For a fuller understanding of the nature and advantages of the present invention, reference should be made to the following detailed description taken together with the accompanying figures.

BRIEF DESCRIPTION OF THE DRAWING

FIGS. 1a and 1b illustrate a comparison of NEXAFS spectra obtained from a DLC film prior to and after hydrogen passivation, wherein in FIG. 1a the hydrogen passivation was done at ~1 cm spacing between the filament and the DLC film and FIG. 1b the hydrogen passivation was done at ~3.5 cm spacing between the filament and the DLC film.

FIGS. 2a and 2b illustrate a comparison of NEXAFS spectra obtained from DLC films prior to and after exposure to the ambient atmosphere, wherein in FIG. 2a the DLC film sample was hydrogen passivated after Ar ion irradiation, and in FIG. 2b the DLC film sample was not hydrogen passivated after Ar ion irradiation.

DESCRIPTION OF THE PREFERRED EMBODIMENTS

DLC films are amorphous carbon films, typically formed by sputter deposition from a graphite target, and are generally called "diamond-like" because of their hardness rather than their crystalline structure. They may also be formed by sputtering in the presence of a hydrogen-containing gas, in which case they are referred to as amorphous hydrogenated DLC films. Tsai et at. in "Structure and Properties of Sputtered Carbon Overcoats on Rigid Magnetic Media Disks", *J. Vac. Science Technology* A6(4), July/August 1988, pp. 2307–2314, describe DLC films for use as protective overcoats for magnetic recording disks. IBM's U.S. Pat. No. 4,778,582 describes a protective hydrogenated DLC disk overcoat formed by sputtering a graphite target in the presence of Ar and hydrogen (H2). The DLC films may also be formed by plasma-enhanced chemical vapor deposition (PECVD) and may include nitrogen in addition to hydrogen, as described by Kaufman et al., *Phys. Rev. B*, Vol. 39, June 1989, p. 13053.

As part of the work leading to the present invention, it was discovered that the anchoring energy of a liquid crystal on an ion beam treated surface of a DLC film is not stable, but decreases substantially (about 3 to 10 times) over a period of few weeks. In order to investigate the structural origin of this decrease, Near Edge X-ray Absorption Spectroscopy (NEXAFS) was used. NEXAFS measures the surface composition of functional groups and their orientation. The most prevalent functional groups on a DLC surface are carbon-carbon double bonds (C=C), carbonyl (C=O), carboxyl (COOH), carbon-carbon single bonds (C—C), and carbon-hydrogen bonds. The anchoring energy is primarily determined by the difference in number of C=C bonds with orientation along two orthogonal directions in the surface plane. The relevant directions are parallel and perpendicular to the ion beam incidence direction. In one NEXAFS study the orientation and chemical composition of the various functional groups listed above were monitored as a function of measurement temperature up to a maximum of 190° C. No change in NEXAFS spectra was observed, thus ruling out that the anchoring energy decrease is a time dependent structural relaxation process. In another NEXAFS study the chemical composition of functional groups and their orientation at the ion beam treated DLC surface was observed as a function of liquid crystal exposure time. It was determined that the decrease in anchoring energy is a direct result of the chemical modification of the ion beam treated DLC surface. In particular, the measured difference in orientation of C=C bonds progressively decreases with increased exposure to the LCs. Furthermore, as the LC exposure increases there is an increase in C—H and carboxyl groups in the bulk of the carbon film. No change was observed in the carbonyl groups.

To understand why the LC reacts with the ion beam treated surface, the effect of an ion beam on the DLC surface should be considered. The ion beam irradiation breaks bonds at the DLC surface. Since the ion beam is well collimated the bond breaking process has preferential direction. Thus an amorphous (in-plane isotropic) surface is converted to a surface with asymmetric orientation of chemical bonds. The result is alignment of the liquid crystal along ion beam incidence direction. This bond breaking process leaves the DLC surface with lot of dangling bonds (free radicals). It should be noted that these dangling bonds are not just restricted to the surface of the DLC film but do extend into the bulk at a lowered concentration. These dangling bonds are highly reactive and readily react with a component within the liquid crystal. This reaction is the primary cause of the lowered anchoring energy.

The present invention involves the passivation of the ion beam treated DLC surface while preserving the asymmetric orientation of the functional groups present at the surface. In the previously cited '946 patent a liquid crystal alignment layer was created by bombarding DLC films with argon or mixtures of argon with hydrogen or some other inert gases. Typically, this bombarding process used energetic ions with energies of about 50 to 300 eV. These energetic ions and the accompanying neutrals are capable of breaking bonds upon contact with the DLC film and hence during creation of the alignment layer they sputter the surface of the DLC film. Since the bond breaking process dominates even in the presence of hydrogen there is a continual net creation of uncompensated bonds (so called dangling bonds). Thus it has been determined that the mere inclusion of hydrogen in the bombarding gas is not sufficient to passivate the dangling bonds.

In the present invention it has been determined that to prevent bond breaking it is essential to have hydrogen atoms contact the surface of the DLC film with energies less than the typical bond energies of C—C bonds. Thus, ideally the hydrogen atoms arriving at the DLC surface should have close to thermal energies. Because the hydrogen atoms are extremely reactive even at thermal energies they can effectively passivate the dangling bonds. The present invention describes this process to passivate the dangling bonds created during the ion bombarding step.

Experimental Setup

The DLC films used were 30 nm thick and prepared by standard sputtering process. The films were mounted in an ultra-high vacuum (UHV) chamber with a base pressure $\sim 2 \times 10^{-9}$ torr. These films were irradiated by 500 eV Ar ions. The irradiaton process conditions were emission current of 20 mA, Ar pressure of $\sim 2.3 \times 10^{-7}$ torr, and irradiation time of 10 minutes. The NEXAFS spectra were then measured from these irradiated DLC films to determine the surface functional group composition.

Following the irradiation and the NEXAFS measurements, the DLC films were then hydrogen passivated. A hot tungsten filament at 1800° K. in hydrogen gas pressure of $1 \times 10^{-6}$ torr was used as a source of hydrogen atoms (J. N. Smith, Jr. and W. L. Fite, *J. Chem. Phys.* 37, 898 (1962)). The tungsten filament may be selected to have desired dimensions and thus may also have the shape of a ribbon. The ribbon-shaped filament was heated by a DC power supply and its temperature controlled by the applied voltage. The filament was stretched across two supports in the UHV chamber and the substrates on which the DLC films were deposited were located beneath the stretched filament. The distance between the DLC film surface and the heated filament was adjustable within a range of 1 to 4 cm. The hydrogen atomization rate (the rate at which $H_2$ is dissociated into H atoms) is a function of the tungsten filament temperature and peaks at around 2500° K. Higher temperatures are more effective in removing any initial oxide layer on the tungsten filament, but at higher temperatures the filament must be located farther from the substrate to avoid extreme heating of the DLC surface. Typical passivation time in the NEXAFS experiment was 10 minutes. The NEXAFS spectra were then measured following the hydrogen passivation step. In an actual manufacturing setup, the substrates with the DLC films would be located on a movable platform that would be moved beneath the tungsten filament at a rate of several mm/sec.

To determine the effectiveness of the hydrogen passivation process NEXAFS spectra were measured from hydrogen passivated and non-passivated DLC film samples prior to and after exposure of the DLC films to the ambient atmosphere. Both total electron and Auger electron yield NEXAFS spectra were measured simultaneously. The Auger electron yield is sensitive to the top 2 nm of the DLC film. Since LC anchoring is mainly determined by interactions between the LC and the surface of the DLC film, only normalized Auger electron yield NEXAFS spectra are shown here.

Experimental Results

FIGS. 1a–1b show the effect of hydrogen atom exposure on Ar ion bombarded DLC films. This Ar ion bombarding was done in a UHV chamber with base pressure of less than $5 \times 10^{-9}$ torr. This low base pressure makes it possible to maintain the DLC film surface clean. The NEXAFS spectra indicated by the thin solid line establish the chemical signature of the UHV Ar sputtered surface. The UHV Ar sputtered sample was then exposed to hydrogen atom flux from a hot tungsten ribbon-shaped filament in the same UHV chamber. The sample in FIG. 1a was exposed to higher hydrogen atom flux than the sample in FIG. 1b due to the closer proximity of the sample to the tungsten filament (1 cm vs. 3.5 cm). The NEXAFS spectra indicated by the medium thick solid line establish the chemical signature of the hydrogen atom exposed samples. The peak assigned to C=C double bonds narrows, which indicates a decrease in disorder in the carbon film due to the passivation of dangling bonds. There is an increase in C—H bonds and also in C—C bonds. The increase in C—H bonds is direct proof of the passivation of dangling bonds. The increase in C—C bonds is a consequence of the narrowing of the C=C peak. The thickest solid line indicates the difference between the two NEXAFS spectra in each panel and is included to accentuate the changes occurring upon hydrogen atom exposure.

FIGS. 2a–2b show the effect of air exposure on a hydrogen passivated DLC film sample (FIG. 2a) and a non-passivated sample (FIG. 2b). Both samples were prepared in the UHV chamber and probed with NEXAFS prior to the air exposure. The NEXAFS spectra indicated by the thin solid line establish the chemical signature of the two samples prior to air exposure. These samples were exposed to the laboratory ambient atmosphere for about 15 minutes. The samples were then introduced into the UHV chamber and probed. The NEXAFS spectra indicated by the medium thick line establish the chemical signature of the two samples after the air exposure. The hydrogen atom passivated sample shows a relatively modest modification of the sample surface (FIG. 2a) as indicated by only a slight decrease in C=C bond intensity. There is a small increase in carbonyl (C=O) and carboxyl (O=C—OH) peak. On the other hand, the non-passivated sample (FIG. 1b) shows dramatic changes. There is substantial decrease in the number of C=C bonds and a substantial increase in the carbonyl and carboxyl peaks. The changes observed in FIG. 1b can be explained by reaction of ambient gases with the DLC film or by adsorption of atmospheric species. The number of C=C bonds (peak at ~285 eV) decrease whereas there is formation of carbonyl (peak at ~286.5 eV) and carboxyl (peak at ~288.5 eV) groups at the surface of the DLC film. Interestingly, an ion beam treated sample in contact with LC for 14 days showed similar features in NEXAFS spectra to that observed for the ambient exposed sample of FIG. 2b (i.e., in both cases distinct peaks are observed for carbonyl and carboxyl groups). Furthermore, the effect of ambient exposure, which is reduction in C=C bonds and increase in carboxyl and carbonyl groups, parallels trends seen on extended LC exposure of samples. The observation that hydrogen passivation preserves C=C bonds suggests that hydrogen passivation stabilizes the ion beam treated DLC. Thus it can be concluded that hydrogen passivation will prevent deterioration of anchoring energy with increased exposure to LC. Thus this data clearly establishes that hydrogen atom passivation improves the stability of the Ar sputtered carbon surfaces.

While the method of exposing the DLC film to hydrogen atoms described above is the preferred method, other known methods will also result in passivation of the ion beam irradiated surface of the DLC film. In one alternative method, an RF (13.56 MHz) plasma discharge free radical source can be used instead of the hot filament. The use of a commercial RF source from Oxford Applied Research (Oxfordshire, UK) for generating atomic hydrogen beams is described by Rouleau and Park, *J. Appl. Phys.* 73, 4610 (1993). The hydrogen atoms in those beams are at thermal energies. The exposure of the ion beam irradiated DLC film surface to a beam of atomic hydrogen would also be an effective way to passivate the surface.

The passivation step in the above described process was done in a separate UHV chamber. However, in a manufacturing process, the exposure to atomic hydrogen may also take place in the same ion beam chamber where the Ar ion irradiation is done.

The present invention has been described with experimental data for a DLC alignment layer that was ion irradiated to cause the alignment of the LCs when they are deposited. However, as described in the previously cited '114 patent, a carbon alignment layer can be made without the separate step of ion irradiation when a carbon film is formed by directional deposition of carbon. The present invention is also applicable to passivate this type of carbon alignment layer.

The present invention is also applicable to a carbon alignment layer that is formed by the Ar ion irradiation of a polyimide film. Polyimides are characterized by the presence of the phthalimide structure in the polymer backbone (P. E. Cassidy, *Thermally Stable Polymers—Syntheses and Properties*, Marcel Dekker, Inc., New York, 1980, pp. 94–129). Polyimide films are used as the alignment layers for liquid crystal displays, and the irradiation of these films with Ar ions to replace the conventional rubbing process is described in the previously cited '826 patent. The Ar ion irradiation causes the formation of a surface of essentially amorphous carbon on the polyimide film. Detailed NEXAFS studies of Ar ion beam treated polyimide films were performed. The NEXAFS spectrum of the ion beam irradiated polyimide surface closely resembles that of the ion beam irradiated DLC and the DLC film before irradiation. Thus the bond breaking occurring during the ion beam irradiation step transforms the polyimide into an amorphous carbon like structure. The total electron yield NEXAFS measurements which have higher depth sensitivity does indicate that this transformation is limited to only the top few nanometers of the polyimide film. The close resemblance in structure observed for ion beam treated polyimide film and ion beam treated DLC is suggestive of close resemblance in chemical properties of these two materials. Hence the hydrogen passivation process is believed to be fully applicable to passivate the surface of an ion beam irradiated polyimide film.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for forming a passivated carbon alignment layer on a substrate of a liquid crystal display comprising:

forming a carbon alignment layer on the substrate; and exposing the surface of the carbon alignment layer with atomic hydrogen to passivate the surface of the layer to thereby form the passivated carbon alignment layer.

2. The method of claim 1 wherein the carbon alignment layer is a diamond-like carbon (DLC) film and further comprising irradiating the DLC film with Argon ions prior to atomic hydrogen exposure.

3. The method of claim 1 wherein forming the carbon alignment layer on the substrate comprises providing a polyimide film on the substrate and irradiating the polyimide film with Argon ions to form the carbon alignment layer on the surface of the polyimide film.

4. The method of claim 1 wherein exposing the surface to atomic hydrogen comprises locating the alignment layer near a filament and heating the filament in the presence of hydrogen gas to dissociate the hydrogen gas into atomic hydrogen.

5. The method of claim 1 wherein exposing the surface to atomic hydrogen comprises directing a beam of atomic hydrogen at the surface.

6. A method for forming a passivated carbon alignment layer on a substrate of a liquid crystal display comprising:

forming a diamond-like carbon film on the substrate;

irradiating the film with an ion beam to modify the surface of the film; and exposing the surface of the ion beam irradiated film to hydrogen atoms to passivate the surface of the film and thereby form the carbon alignment layer.

7. The method of claim 6 wherein irradiating the film comprises irradiating the film with Argon ions.

8. The method of claim 6 wherein exposing the film surface to hydrogen atoms comprises locating the film near a tungsten filament and heating the filament in the presence of hydrogen gas to dissociate the hydrogen gas into atomic hydrogen.

9. The method of claim 6 wherein exposing the film surface to hydrogen atoms comprises directing a beam of atomic hydrogen at the film.

10. A method for passivating a carbon alignment layer on a substrate of a liquid crystal display to stabilize the anchoring of liquid crystals to the layer, the method comprising exposing the surface of the carbon layer with atomic hydrogen before deposition of the liquid crystals.

11. The method of claim 10 wherein exposing the carbon layer surface to hydrogen atoms comprises locating the layer near a tungsten filament and heating the filament in the presence of hydrogen gas to dissociate the hydrogen gas into atomic hydrogen.

12. The method of claim 10 wherein the carbon alignment layer to be passivated was ion irradiated prior to its exposure to the atomic hydrogen.

13. The method of claim 10 wherein the carbon alignment layer to be passivated was formed by directional deposition of carbon without subsequent ion irradiation.

14. A method for forming an alignment layer on a substrate of a liquid crystal display comprising:

providing a polyimide film:

irradiating the polyimide film with ions to form a carbon alignment layer on the surface of the polyimide film; and exposing the surface of the carbon alignment layer with atomic hydrogen to passivate the surface of the carbon alignment layer.

* * * * *